United States Patent
Zhang et al.

(10) Patent No.: US 12,235,557 B2
(45) Date of Patent: Feb. 25, 2025

(54) DISPLAYING BASE PLATE AND MANUFACTURING METHOD THEREOF, AND DISPLAYING DEVICE

(71) Applicant: BOE Technology Group Co., Ltd., Beijing (CN)

(72) Inventors: Zhen Zhang, Beijing (CN); Fuqiang Li, Beijing (CN); Zhenyu Zhang, Beijing (CN); Yunping Di, Beijing (CN); Lizhong Wang, Beijing (CN); Zheng Fang, Beijing (CN); Jiahui Han, Beijing (CN); Yawei Wang, Beijing (CN); Chenyang Zhang, Beijing (CN); Chengfu Xu, Beijing (CN); Ce Ning, Beijing (CN); Pengxia Liang, Beijing (CN); Feihu Zhou, Beijing (CN); Xianqin Meng, Beijing (CN); Weiting Peng, Beijing (CN); Qiuli Wang, Beijing (CN); Binbin Tong, Beijing (CN); Rui Huang, Beijing (CN); Tianmin Zhou, Beijing (CN); Wei Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/765,769

(22) PCT Filed: Jun. 29, 2021

(86) PCT No.: PCT/CN2021/103218
§ 371 (c)(1),
(2) Date: Mar. 31, 2022

(87) PCT Pub. No.: WO2023/272505
PCT Pub. Date: Jan. 5, 2023

(65) Prior Publication Data
US 2024/0103328 A1    Mar. 28, 2024

(51) Int. Cl.
*G02F 1/1368*    (2006.01)
*G02F 1/1362*    (2006.01)
*H01L 27/12*    (2006.01)

(52) U.S. Cl.
CPC ...... *G02F 1/1368* (2013.01); *G02F 1/136286* (2013.01); *H01L 27/124* (2013.01); *H01L 27/1248* (2013.01); *H01L 27/1259* (2013.01)

(58) Field of Classification Search
CPC .................................................. G02F 1/1368
See application file for complete search history.

(56) References Cited

U.S. PATENT DOCUMENTS

2003/0053791 A1    3/2003   Yoshida
2005/0078240 A1*   4/2005   Murade ............ G02F 1/136209
                                                   349/110

(Continued)

FOREIGN PATENT DOCUMENTS

| CN | 1405610 A | 3/2003 |
| CN | 1641450 A | 7/2005 |

(Continued)

OTHER PUBLICATIONS

Extended (Supplementary) European Search Report dated Jan. 26, 2024, issued in counterpart EP Application No. 21947462.4. (10 pages).

*Primary Examiner* — Sang V Nguyen
(74) *Attorney, Agent, or Firm* — WHDA, LLP

(57) ABSTRACT

A displaying base plate and a manufacturing method thereof, and a displaying device. The displaying base plate includes a substrate, and a first electrode layer disposed on one side of the substrate, wherein the first electrode layer includes a first electrode pattern; a first planarization layer disposed on one side of the first electrode layer that is away from the substrate, wherein the first planarization layer is provided with a through hole, and the through hole penetrates the first (Continued)

planarization layer, to expose the first electrode pattern; and a second electrode layer, a second planarization layer and a third electrode layer that are disposed in stack on one side of the first planarization layer that is away from the substrate, wherein the second electrode layer is disposed closer to the substrate, the second electrode layer is connected to the first electrode pattern and the third electrode layer.

9 Claims, 12 Drawing Sheets

(56) References Cited

U.S. PATENT DOCUMENTS

| | | | |
|---|---|---|---|
| 2005/0253984 A1* | 11/2005 | Kim | G02F 1/1362 349/106 |
| 2006/0012742 A1 | 1/2006 | Tsai et al. | |
| 2007/0170506 A1* | 7/2007 | Onogi | H01L 29/78609 257/E27.111 |
| 2011/0169005 A1* | 7/2011 | Saito | H01L 27/1255 257/59 |
| 2014/0043553 A1 | 2/2014 | Lo et al. | |
| 2017/0168347 A1 | 6/2017 | Li | |
| 2020/0043954 A1 | 2/2020 | Wang et al. | |
| 2020/0111433 A1* | 4/2020 | Kikuchi | H10K 59/12 |
| 2020/0166793 A1 | 5/2020 | Huang et al. | |
| 2020/0285090 A1* | 9/2020 | Tanaka | G02F 1/1368 |
| 2021/0011316 A1* | 1/2021 | Du | G02F 1/136286 |
| 2021/0336162 A1* | 10/2021 | Guo | H10K 71/00 |
| 2022/0276540 A1* | 9/2022 | Wang | G02F 1/136245 |
| 2022/0308377 A1* | 9/2022 | Ozeki | H01L 29/7869 |

FOREIGN PATENT DOCUMENTS

| | | |
|---|---|---|
| CN | 101009333 A | 8/2007 |
| CN | 102778797 A | 11/2012 |
| CN | 105575978 A | 5/2016 |
| CN | 105576036 A | 5/2016 |
| CN | 108231671 A | 6/2018 |
| CN | 207503978 U | 6/2018 |
| CN | 109003991 A | 12/2018 |
| CN | 110543046 A | 12/2019 |
| CN | 111273496 A | 6/2020 |
| CN | 111381411 A | 7/2020 |
| CN | 111665668 A | 9/2020 |
| CN | 112965310 A | 6/2021 |

* cited by examiner

DISPLAYING BASE PLATE AND MANUFACTURING METHOD THEREOF, AND DISPLAYING DEVICE

TECHNICAL FIELD

The present disclosure relates to the technical field of displaying, and particularly relates to a displaying base plate and a manufacturing method thereof, and a displaying device.

BACKGROUND

Currently, liquid-crystal displays are still a mainstream display. The display panel in a liquid-crystal display generally includes an array base plate, a cell base plate, and a liquid crystal filled between the array base plate and the cell base plate. However, with the increasing of the pixel density of display panels, the size of a single pixel unit is increasingly lower. The increasingly lower pixel aperture ratio is a problem in the art required to be solved urgently.

SUMMARY

The present disclosure provides a displaying base plate, wherein the displaying base plate includes:
 a substrate, and a first electrode layer disposed on one side of the substrate, wherein the first electrode layer includes a first electrode pattern;
 a first planarization layer disposed on one side of the first electrode layer that is away from the substrate, wherein the first planarization layer is provided with a through hole, and the through hole penetrates the first planarization layer, to expose the first electrode pattern; and
 a second electrode layer, a second planarization layer and a third electrode layer that are disposed in stack on one side of the first planarization layer that is away from the substrate, wherein the second electrode layer is disposed close to the substrate, an orthographic projection of the second electrode layer on the substrate covers an orthographic projection of the through hole on the substrate, the second electrode layer is connected to the first electrode pattern and the third electrode layer, and the second planarization layer fills the through hole to planarize the through hole.

In an optional implementation, the orthographic projection of the through hole on the substrate entirely falls in the orthographic projection of the second electrode layer on the substrate.

In an optional implementation, the orthographic projection of the second electrode layer on the substrate entirely falls in an orthographic projection of the third electrode layer on the substrate.

In an optional implementation, an orthographic projection of the second planarization layer on the substrate entirely falls in an orthographic projection of the third electrode layer on the substrate.

In an optional implementation, shapes of the through hole and the second electrode layer are rectangle, circle or ellipse.

In an optional implementation, the displaying base plate includes a active area and a non-active area, and the active area includes an opening region and a non-opening region;
 the displaying base plate further includes: a first thin-film transistor disposed between the substrate and the first electrode layer, the first thin-film transistor is located at the active area, the first thin-film transistor includes a first active layer, a first grid insulating layer and a first grid that are disposed in stack, and the first active layer includes a drain contacting region; and
 the first electrode layer further includes a second electrode pattern formed integrally with the first electrode pattern, the second electrode pattern is connected to the drain contacting region, and the first electrode pattern is located at the non-opening region.

In an optional implementation, the first active layer is disposed close to the substrate, a first interlayer dielectric layer, a first source and a first passivation layer are disposed in stack on one side of the first grid that is away from the substrate, the first electrode layer is disposed on one side of the first passivation layer that is away from the substrate, and the second electrode pattern and the drain contacting region are connected by via holes disposed in the first passivation layer, the first interlayer dielectric layer and the first grid insulating layer.

In an optional implementation, a material of the first electrode layer is a transparent electrically conductive material.

In an optional implementation, the drain contacting region is located at the non-opening region, and a material of the first electrode layer is a metal.

In an optional implementation, the drain contacting region is located at the non-opening region, and orthographic projections of the first grid insulating layer, the first interlayer dielectric layer and the first passivation layer on the substrate do not intersect or overlap with the opening region.

In an optional implementation, the first active layer is disposed close to the substrate, a first interlayer dielectric layer and a first source-drain electrode layer are disposed in stack on one side of the first grid that is away from the substrate, the first source-drain electrode layer includes a first source and a first drain that are disposed in the same one layer, the first drain and the drain contacting region are connected by via holes disposed in the first interlayer dielectric layer and the first grid insulating layer, the first electrode layer is disposed on one side of the first drain that is away from the substrate, and the second electrode pattern contacts and is connected to the first drain.

In an optional implementation, the drain contacting region is located at the non-opening region, and a material of the first drain is a metal.

In an optional implementation, the displaying base plate includes a active area and a non-active area, and the active area includes an opening region and a non-opening region;
 the displaying base plate further includes: a first thin-film transistor disposed on one side of the substrate that is close to the first electrode layer, the first thin-film transistor is located at the active area, the first thin-film transistor includes a first active layer, a first grid insulating layer, a first grid, a first interlayer dielectric layer and a first source that are disposed in stack, the first active layer is disposed close to the substrate, and the first active layer includes a drain contacting region, and the drain contacting region is located at the opening region;
 orthographic projections of the first grid insulating layer and the first interlayer dielectric layer on the substrate do not intersect or overlap with the opening region; and
 the drain contacting region is the first electrode pattern.

In an optional implementation, a material of the first active layer includes a metal oxide.

In an optional implementation, the active area further includes a data line and a scanning line, the first source extends in a first direction to form the data line, the first grid extends in a second direction intersecting with the first direction to form the scanning line, and both of orthographic projections of the data line and the scanning line on the substrate cover an orthographic projection of a channel region of the first active layer on the substrate.

In an optional implementation, a material of the first active layer includes a polycrystalline silicon, and the orthographic projection of the data line on the substrate covers an orthographic projection of the first active layer on the substrate.

In an optional implementation, a barrier layer and a second interlayer dielectric layer are disposed in stack between the first active layer and the substrate, the barrier layer is disposed close to the substrate, and an orthographic projection of the barrier layer on the substrate covers an orthographic projection of a channel region of the first active layer on the substrate.

In an optional implementation, the active area further includes a data line and a scanning line, and the orthographic projection of the barrier layer on the substrate covers orthographic projections of the data line and the scanning line on the substrate.

In an optional implementation, the barrier layer is connected to a constant-electric-potential input terminal.

In an optional implementation, the barrier layer and the first source are connected by via holes disposed in the second interlayer dielectric layer, the first grid insulating layer and the first interlayer dielectric layer.

In an optional implementation, a material of the barrier layer includes at least one of molybdenum, aluminum and silver.

In an optional implementation, the displaying base plate further includes a second thin-film transistor, the second thin-film transistor is located at the non-active area, and a material of an active layer of the second thin-film transistor includes a polycrystalline silicon.

In an optional implementation, a channel region of the first active layer includes a first channel region, a first resistor region and a second channel region that are disposed sequentially in a first direction, the first grid includes a first sub-grid and a second sub-grid that are separately disposed, an orthographic projection of the first sub-grid on the substrate covers an orthographic projection of the first channel region on the substrate, and an orthographic projection of the second sub-grid on the substrate covers an orthographic projection of the second channel region on the substrate.

In an optional implementation, a second passivation layer and a fourth electrode layer are disposed in stack on the one side of the first electrode layer that is away from the substrate, the fourth electrode layer is transparent and is connected to a first constant-electric-potential input terminal, the second passivation layer is disposed close to the substrate, and orthographic projections of the first electrode layer and the fourth electrode layer on the substrate overlap; and the first planarization layer is disposed on one side of the fourth electrode layer that is away from the substrate, the through hole penetrates the second passivation layer, and orthographic projections of the through hole and the fourth electrode layer on the substrate do not intersect or overlap.

In an optional implementation, the displaying base plate includes an opening region, a color-resistor layer is disposed on the one side of the first electrode layer that is away from the substrate, and the orthographic projection of the color-resistor layer on the substrate covers the opening region; and the first planarization layer is disposed on one side of the color-resistor layer that is away from the substrate, and the orthographic projection of the through hole on the substrate and the orthographic projection of the color-resistor layer on the substrate do not intersect or overlap.

In an optional implementation, a third passivation layer and a common-electrode layer are disposed in stack on one side of the third electrode layer that is away from the substrate, the third passivation layer is disposed close to the substrate, the common-electrode layer includes a plurality of strip electrodes, and a material of the common-electrode layer is a metal.

In an optional implementation, an isolating pillar is disposed on the one side of the first planarization layer that is away from the substrate, and the isolating pillar and the second planarization layer are formed at the same time.

The present disclosure provides a displaying device, wherein the displaying device includes the displaying base plate according to any one of the above embodiments.

The present disclosure provides a manufacturing method of a displaying base plate, wherein the manufacturing method includes:

providing a substrate;

forming a first electrode layer on one side of the substrate, wherein the first electrode layer includes a first electrode pattern;

forming sequentially a first planarization layer on one side of the first electrode layer that is away from the substrate, wherein the first planarization layer is provided with a through hole, and the through hole penetrates the first planarization layer, to expose the first electrode pattern; and forming sequentially a second electrode layer, a second planarization layer and a third electrode layer on one side of the first planarization layer that is away from the substrate, wherein an orthographic projection of the second electrode layer on the substrate covers an orthographic projection of the through hole on the substrate, the second electrode layer is configured to be connected to the first electrode pattern and the third electrode layer, and the second planarization layer is configured for planarizing the through hole.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are disposed below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are embodiments of the present disclosure, and a person skilled in the art may obtain other figures according to these figures without paying creative work. It should be noted that the proportions in the drawings are merely illustrative and do not indicate the actual proportions.

DETAILED DESCRIPTION OF THE EMBODIMENTS

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
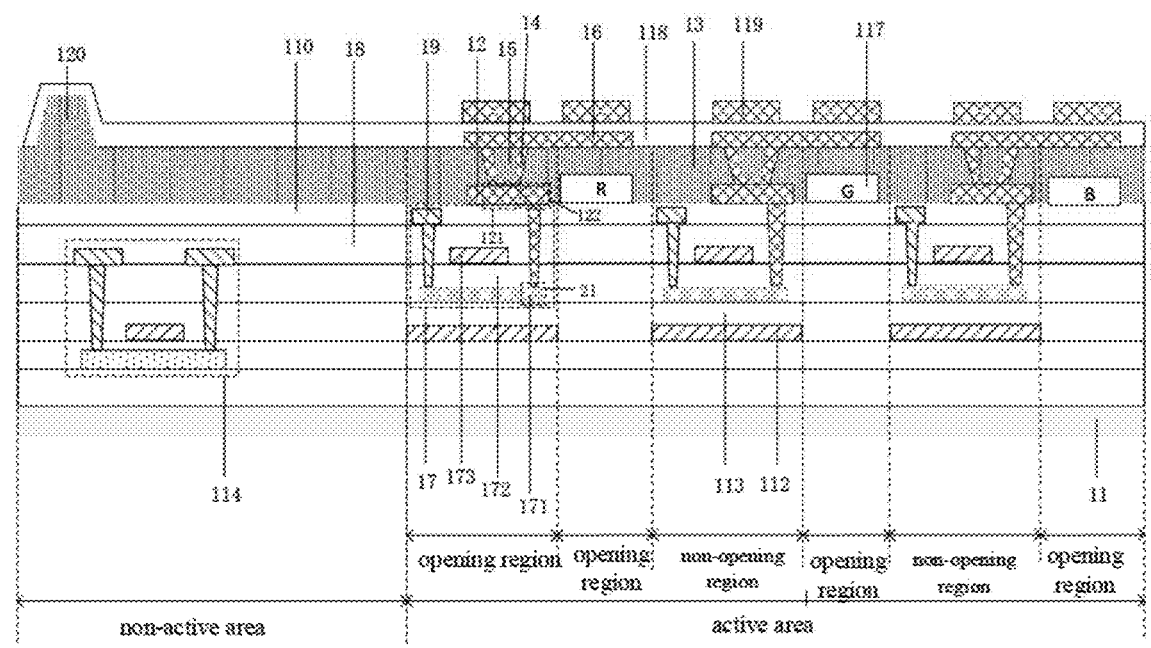
FIG. 1 shows a schematic sectional structural diagram of the displaying base plate according to an embodiment of the present disclosure.
Figure 2:
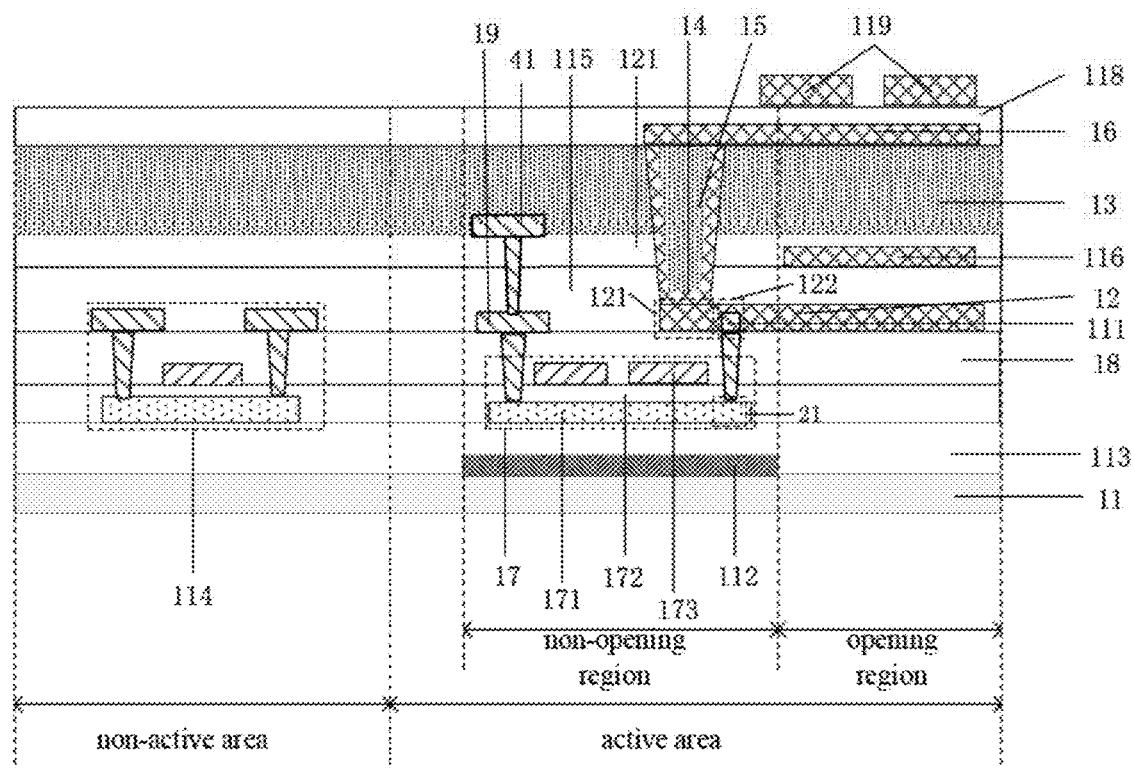
FIG. 2 shows a schematic sectional structural diagram of the displaying base plate according to an embodiment of the present disclosure.
Figure 3:
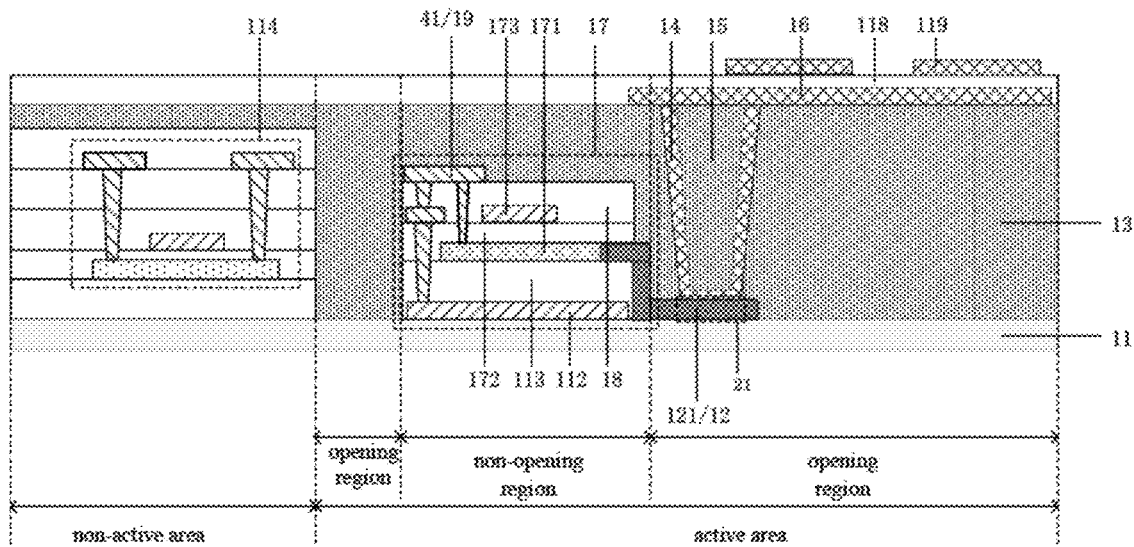
FIG. 3 shows a schematic sectional structural diagram of the displaying base plate according to an embodiment of the present disclosure.

An embodiment of the present disclosure provides a displaying base plate. Referring to FIGS. 1 to 3, the displaying base plate includes: a substrate 11, and a first electrode layer 12 disposed on one side of the substrate 11, wherein the first electrode layer 12 includes a first electrode pattern 121; and a first planarization layer 13 disposed on the one side of the first electrode layer 12 that is away from the substrate 11, wherein the first planarization layer 13 is provided with a through hole, and the through hole penetrates the first planarization layer 13, to expose the first electrode pattern 121.

A second electrode layer 14, a second planarization layer 15 and a third electrode layer 16 that are disposed in stack on the side of the first planarization layer 13 that is away from the substrate 11, wherein the second electrode layer 14 is disposed close to the substrate 11, the orthographic projection of the second electrode layer 14 on the substrate 11 covers the orthographic projection of the through hole on the substrate 11, the second electrode layer 14 is connected to the first electrode pattern 121 and the third electrode layer 16, and the second planarization layer 15 fills the through hole to planarize the through hole.

In an aspect, the second planarization layer 15 disposed inside the through hole fills and levels up the through hole in the first planarization layer 13, which eliminates the deep-hole structure in the first planarization layer 13, and eliminates light leakage caused by the deep-hole structure, whereby it is not required to dispose a large light shielding layer to shield a leaked light, which may increase the pixel aperture ratio of the active area.

In another aspect, due to the third electrode layer 16 is disposed on a flat surface, when the third electrode layer 16 serves as a pixel-electrode layer, it may ensure that the distance between the pixel-electrode layer and the common-electrode layer is maintained to be constant, to enable the electric field to be uniform, and the liquid-crystal deflection to be normal, to prevent light leakage caused by abnormal liquid-crystal deflection, whereby it is not required to provide a large light shielding layer to shield a leaked light, which may increase the pixel aperture ratio of the active area.

In addition, by disposing both of the second electrode layer 14 and the third electrode layer 16, respectively, the problem of a high contact resistance when merely the second electrode layer 14 is disposed may be solved. By lap joining one third electrode layer 16 on the side of the second planarization layer 15 that is away from the substrate 11, the problem of a high contact resistance may be solved.

In an optional implementation, the materials of the first electrode layer 12, the second electrode layer 14 and the third electrode layer 16 may be made of materials such as a transparent electrically conductive material or a metal material and so on, which is not limited in the present embodiment. When all of the materials of the first electrode layer 12, the second electrode layer 14 and third electrode layer 16 are a transparent electrically conductive material, that may further increase the transmittance of the active area. When the materials of the first electrode layer 12 and the second electrode layer 14 are the same, they may be deposited at the same time, and be formed by using a one-step patterning process, which may save one step of a mask process.

The transparent electrically conductive material may, for example, include at least one of transparent metal oxides such as indium tin oxide (ITO), indium zinc oxide (IZO) and oxidized graphene.

In an optional implementation, the orthographic projection of the through hole in the first planarization layer 13 on the substrate 11 entirely falls in the orthographic projection of the second electrode layer 14 on the substrate 11.

In an optional implementation, the orthographic projection of the second electrode layer 14 on the substrate 11 entirely falls in the orthographic projection of the third electrode layer 16 on the substrate 11.

In an optional implementation, the orthographic projection of the second planarization layer 15 on the substrate 11 entirely falls in the orthographic projection of the third electrode layer 16 on the substrate 11.

In an optional implementation, in a plane parallel to the substrate 11, the shapes of the through hole in the first planarization layer 13 and the second electrode layer 14 are rectangle, circle or ellipse, which is not limited in the present embodiment.

In an optional implementation, referring to FIGS. 1 and 2, the displaying base plate includes an active area and a non-active area, and the active area includes an opening region and a non-opening region; and the displaying base plate may further include: a first thin-film transistor 17 disposed between the substrate 11 and the first electrode layer 12, the first thin-film transistor 17 is located at the active area, the first thin-film transistor 17 includes a first active layer 171, a first grid insulating layer 172 and a first grid 173 that are disposed in stack, and the first active layer 171 includes a drain contacting region 21. The first electrode layer 12 may further include a second electrode pattern 122 formed integrally with the first electrode pattern 121, the second electrode pattern 122 is connected to the drain contacting region 21, and the first electrode pattern 121 is located at the non-opening region.

In the present implementation, the first thin-film transistor 17 may be of a top-grid structure (as shown in FIG. 1 to FIG. 2), and may also be of a bottom-grid structure, which is not limited in the present embodiment.

The first grid 173 may be of a single-grid structure (as shown in FIG. 1), a double-grid structure (as shown in FIG. 2) or a multi-grid structure, which is not limited in the present embodiment.

The material of the first active layer 171 may include an amorphous silicon, a polycrystalline silicon, a metal oxide and so on, which is not limited in the present embodiment.

The drain contacting region 21 may be formed by performing conductorization to the material of the first active layer 171. The conductorization may be performed by using processes such as ion doping and plasma treatment.

In order to implement the connection between the second electrode pattern 122 and the drain contacting region 21, in an optional implementation, referring to FIG. 1, the first active layer 171 is disposed close to the substrate 11, a first interlayer dielectric layer 18, a first source 19 and a first passivation layer 110 are disposed in stack on the side of the first grid 173 that is away from the substrate 11, the first electrode layer 12 is disposed on the side of the first passivation layer 110 that is away from the substrate 11, and the second electrode pattern 122 and the drain contacting region 21 are connected by via holes disposed in the first passivation layer 110, the first interlayer dielectric layer 18 and the first grid insulating layer 172.

In the present implementation, the material of the first electrode layer 12 may be a transparent electrically conductive material, which may increase the transmittance of the active area. When the material of the first electrode layer 12 may be a transparent electrically conductive material, the material of the first active layer 171 may include a metal oxide, which may reduce the contact resistance between the second electrode pattern 122 and the drain contacting region 21.

In the present implementation, the material of the first electrode layer 12 may also be a metal material, and the second electrode pattern 122 and the drain contacting region 21 connected to the second electrode pattern 122 may be located at the non-opening region, to further increase the pixel aperture ratio. When the material of the first electrode layer 12 may be a metal material, that may reduce the contact resistance between the second electrode pattern 122 and the drain contacting region 21.

In the present implementation, referring to FIG. 1, the second electrode pattern 122 in the first electrode layer 12 also serve as the drain of the first thin-film transistor, and is connected to the drain contacting region 21 by a via hole. By disposing the source and the drain of the first thin-film transistor in different layers, the distance therebetween may be reduced, which facilitates to increase the resolution of the displaying base plate.

In order to further increase the transmittance of the opening region, and the orthographic projections of the first grid insulating layer 172, the first interlayer dielectric layer 18 and the first passivation layer 110 on the substrate 11 may not intersect or overlap with the opening region. By excavating out the first grid insulating layer 172, the first interlayer dielectric layer 18 and the first passivation layer 110 in the opening region, the film-layer thickness of the opening region may be reduced, and the quantity of the film-layer interfaces may be reduced, whereby the light-ray transmittance of the opening region may be increased.

In order to implement the connection between the second electrode pattern 122 and the drain contacting region 21, in another optional implementation, referring to FIG. 2, the first active layer 171 is disposed close to the substrate 11, a first interlayer dielectric layer 18 and a first source-drain electrode layer are disposed in stack on the side of the first grid 173 that is away from the substrate 11, the first source-drain electrode layer includes a first source 19 and a first drain 111 that are disposed in the same one layer, the first drain 111 and the drain contacting region 21 are connected by via holes disposed in the first interlayer dielectric layer 18 and the first grid insulating layer 172, the first electrode layer 12 is disposed on the side of the first drain 111 that is away from the substrate 11, and the second electrode pattern 122 contacts and is connected to the first drain 111.

In the present implementation, the material of the first drain 111 is a metal. The first drain 111 of the metal material may reduce the contact resistance between the first drain 111 and the drain contacting region 21. In order to prevent occupying the opening region, the drain contacting region 21 and the first drain 111 connected to the drain contacting region 21 may be located in the non-opening region.

In the present implementation, the first electrode layer 12 serves as a transferring layer, and the material of the first electrode layer 12 may be a transparent electrically conductive material, which may increase the aperture ratio and the transmittance.

When the first active layer 171 is disposed close to the substrate 11, the first thin-film transistor 17 is of a top-grid structure. As compared with conventional bottom-grid structures, due to the first grid 173 does not require the shielding of a backlight, the size may be reduced, and accordingly the parasitic capacitance formed between the first grid 173 and the other film layers may be reduced, to reduce the power consumption.

In order to further increase the transmittance of the opening region, the orthographic projections of the first grid insulating layer 172 and the first interlayer dielectric layer 18 on the substrate 11 may not intersect or overlap with the opening region. By excavating out the first grid insulating layer 172 and the first interlayer dielectric layer 18 in the opening region, the film-layer thickness of the opening region may be reduced, and the quantity of the film-layer interfaces may be reduced, whereby the light-ray transmittance of the opening region may be increased.

In an optional implementation, referring to FIG. 3, the displaying base plate includes an active area and a non-active area, and the active area includes an opening region and a non-opening region; the displaying base plate further includes: a first thin-film transistor 17 disposed on the one side of the substrate 11 that is close to the first electrode layer 12, the first thin-film transistor 17 is located at the active area, the first thin-film transistor 17 includes a first active layer 171, a first grid insulating layer 172, a first grid 173, a first interlayer dielectric layer 18 and a first source 19 that are disposed in stack, the first active layer 171 is disposed close to the substrate 11, the first active layer 171 includes a drain contacting region 21, and the drain contacting region 21 is located at the opening region; and the drain contacting region 21 is the first electrode pattern 121.

In order to increase the transmittance of the opening region, the orthographic projections of the first grid insulating layer 172 and the first interlayer dielectric layer 18 on the substrate 11 may not intersect or overlap with the opening region.

Due to the drain contacting region is located in the opening region, the drain contacting region may be lap joined to the first electrode layer in the opening region, and it is not required to manufacture a transferring electrode or a drain, which may increase the aperture ratio and the transmittance of the active area. Furthermore, due to the material of the first active layer 171 is a transparent metal oxide, even though the drain contacting region 21 of the first active layer 171 is disposed at the opening region, that does not affect the aperture ratio and the transmittance of the active area.

Figure 4:
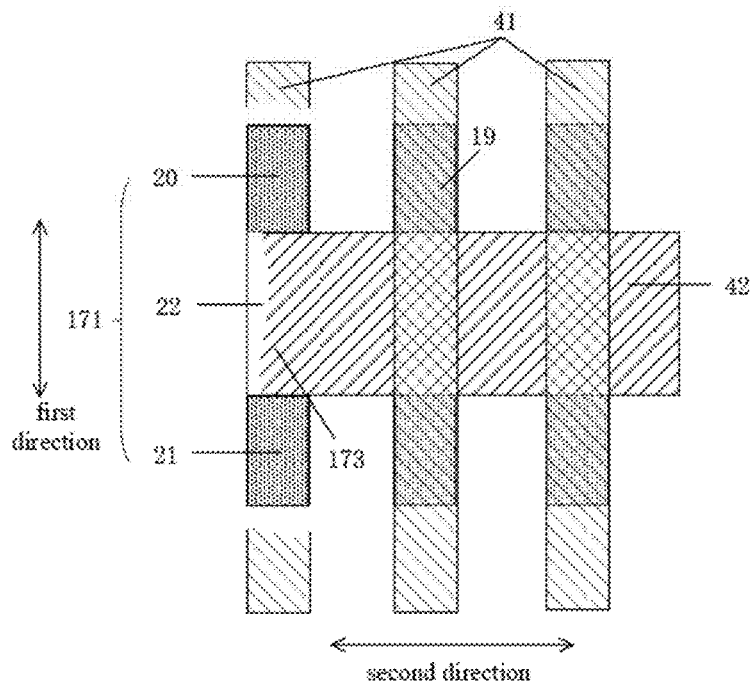
FIG. 4 shows a schematic planar structural diagram of the displaying base plate according to an embodiment of the present disclosure.

In an optional implementation, the active area further includes a data line 41 and a scanning line 42. Referring to FIG. 4, the first source 19 extends in a first direction to form the data line 41, the first grid 173 extends in a second direction intersecting with the first direction to form the scanning line 42, and both of the orthographic projections of the data line 41 and the scanning line 42 on the substrate 11 cover the orthographic projection of the channel region of the first active layer 171 on the substrate 11. The second direction may, for example, be perpendicular to the first direction, as shown in FIG. 4.

When the material of the first active layer 171 includes a polycrystalline silicon, and the orthographic projection of the data line 41 on the substrate 11 covers the orthographic projection of the first active layer 171 on the substrate 11. Due to the material of the polycrystalline silicon of the first active layer 171 is non-transparent, by disposing the first active layer 171 in the non-opening region corresponding to the data line 41, the pixel aperture ratio may be increased.

When the first thin-film transistor 17 is of a top-grid structure, in order to prevent the backlight from irradiating the first active layer 171 to affect the electric characteristics of the first thin-film transistor 17, in an optional implementation, referring to FIG. 1 to FIG. 3, a barrier layer 112 and a second interlayer dielectric layer 113 are disposed in stack between the first active layer 171 and the substrate 11, the barrier layer 112 is disposed close to the substrate 11, the orthographic projection of the barrier layer 112 on the substrate 11 covers the orthographic projection of the channel region of the first active layer 171 on the substrate 11.

In order to further increase the transmittance of the opening region, the orthographic projection of the second interlayer dielectric layer 113 on the substrate 11 may not intersect or overlap with the opening region.

In an optional implementation, the orthographic projection of the barrier layer 112 on the substrate 11 may cover the orthographic projections of the data line 41 and the scanning line 42 on the substrate 11. In other words, the barrier layer 126 is of a net-like structure. The barrier layer of the net-like structure may increase the area of the barrier layer without affecting the aperture ratio, and therefore may reflect more backlight, to increase the transmittance of the backlight.

In an optional implementation, the barrier layer 112 is connected to a constant-electric-potential input terminal. The present implementation may prevent abnormal displaying caused by the drifting of the threshold voltage of the first thin-film transistor 17, to improve the uniformity of the displaying.

In an optional implementation, as shown in FIG. 3, the barrier layer 112 and the first source 19 are connected by via holes disposed in the second interlayer dielectric layer 113, the first grid insulating layer 172 and the first interlayer dielectric layer 18.

In order to further increase the utilization ratio of the backlight, the material of the barrier layer 126 may use a metal material of a high reflectivity. The metal material may include at least one of molybdenum, aluminum, silver and tin. By using the barrier layer of the material of a high reflectivity, the backlight irradiating the barrier layer may be reflected back, and the reflected backlight may be utilized repeatedly, thereby increasing the transmittance of the backlight.

The material of the barrier layer may, for example, be Al/top TIN, Al/top Mo, Al alloy/top TIN or Al alloy/top Mo. Those materials have a good high-temperature stability, and the reflectivity is stable and unchanged before and after high-temperature annealing.

In an optional implementation, the material of the first active layer 171 includes a metal oxide, the displaying base plate further includes a second thin-film transistor 114, the second thin-film transistor 114 is located at the non-active area, and the material of the active layer of the second thin-film transistor 114 includes a polycrystalline silicon.

The second thin-film transistor 114 may be formed by using a process of Low Temperature Poly-Silicon (LTPS), to increase the capacity of circuit driving of the non-active area. The first thin-film transistor 17 may be formed by using a process of indium gallium zinc oxide (IGZO), which may reduce the leakage current, improve the voltage retention rate, and improve the effect of displaying of the active area.

Figure 5:
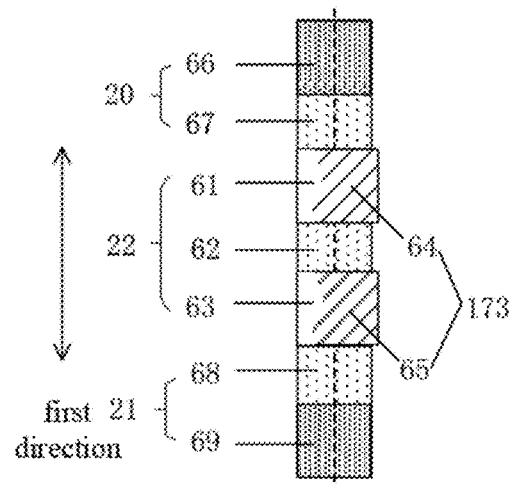
FIG. 5 shows a schematic planar structural diagram of the first thin-film transistor according to an embodiment of the present disclosure.
Figure 6:
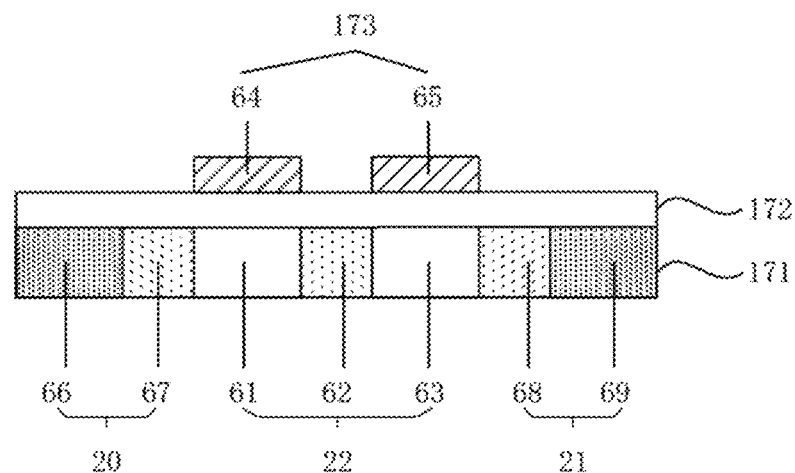
FIG. 6 shows a schematic sectional structural diagram of the first thin-film transistor according to an embodiment of the present disclosure.
Figure 7:
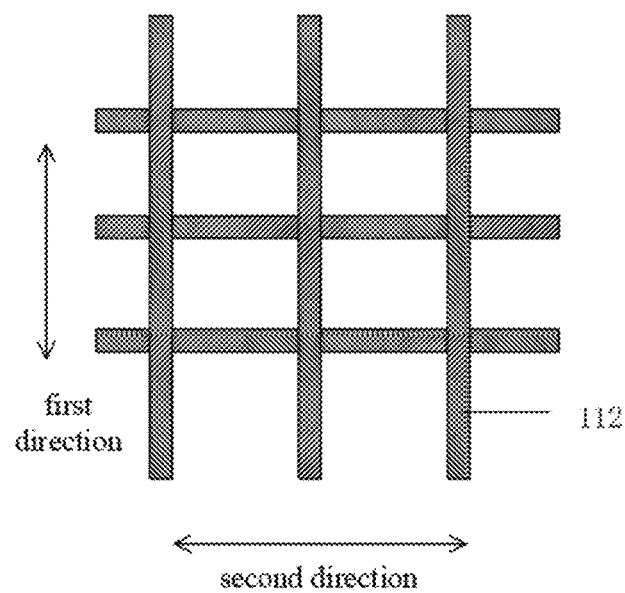
FIG. 7 shows a schematic planar structural diagram of the barrier layer according to an embodiment of the present disclosure.

In an optional implementation, referring to FIG. 5 and FIG. 6, the channel region 22 of the first active layer 171 may include a first channel region 61, a first resistor region 62 and a second channel region 63 that are disposed sequentially in the first direction, the first grid 173 includes a first sub-grid 64 and a second sub-grid 65 that are disposed, respectively, the orthographic projection of the first sub-grid 64 on the substrate 11 covers the orthographic projection of the first channel region 61 on the substrate 11, and the orthographic projection of the second sub-grid 65 on the substrate 11 covers the orthographic projection of the second channel region 63 on the substrate 11.

It should be noted that, in order to clearly identify the first active layer 171, the first sub-grid 64 and the second sub-grid 65 in FIG. 5 are not completely shown.

Referring to FIG. 5 and FIG. 6, the first channel region 61, the first resistor region 62 and the second channel region 63 are disposed sequentially in the first direction, to form an I-shaped channel. The first channel region 61 and the second channel region 63 may be equivalent to two thin-film-transistor switches that are connected in series, and the first resistor region 62 may be equivalent to a resistor that is connected in series between the two thin-film-transistor switches. The first resistor region 62 may be formed by performing processes such as ion doping and plasma treatment to the material of the first active layer 171.

In the present embodiment, by disposing the first resistor region 62 between the first channel region 61 and the second channel region 63, which is equivalent to connecting in series a resistor between two thin-film-transistor switches, the provision of the resistor may inhibit the generation of a leakage current, which may reduce the leakage current of the thin-film transistor, to improve the stability of the threshold voltage.

The first sub-grid 64 is configured to receive a signal for controlling the first channel region 61 to turn on or turn off. The second sub-grid 65 is configured to receive a signal for controlling the second channel region 63 to turn on or turn off. In an optional implementation, the signals received by the first sub-grid 64 and the second sub-grid 65 may be the same, which is not limited in the present embodiment.

In the present implementation, due to the first thin-film transistor is of a double-grid structure, which has a high electric stability, and a good voltage retention rate, that may improve the effect of displaying and the reliability of the displaying base plate. In addition, due to the channel of the first thin-film transistor is an I-shaped channel, it occupies a small area in the pixel unit of the displaying base plate, which may increase the aperture ratio of the displaying base plate, and, especially, may obviously increase the aperture ratio of displaying base plates having a high pixel density. The displaying base plate may be applied to the Virtual Reality (VR) displaying technique, the Augmented Reality (AR) displaying technique and so on.

Referring to FIG. 5 and FIG. 6, a source contacting region 20 in the first active layer 171 includes a first conductor region 66 and a second resistor region 67, and the second resistor region 67 is disposed close to the first channel region 61. The drain contacting region 21 may include a second conductor region 69 and a third resistor region 68, and the third resistor region 68 is disposed close to the second channel region 63. By disposing the second resistor region 67 and the third resistor region 68, the leakage current may be further reduced.

Referring to FIG. 2, a second passivation layer 115 and a fourth electrode layer 116 are disposed in stack on the side of the first electrode layer 12 that is away from the substrate 11, the fourth electrode layer 116 is transparent and is connected to a first constant-electric-potential input terminal, the second passivation layer 115 is disposed close to the substrate 11, and the orthographic projections of the first electrode layer 12 and the fourth electrode layer 116 on the substrate 11 overlap; and the first planarization layer 13 is disposed on the side of the fourth electrode layer 116 that is away from the substrate 11, a through hole penetrates the second passivation layer 115, and the orthographic projections of the through hole and the fourth electrode layer 116 on the substrate 11 do not intersect or overlap.

The first electrode layer 12 and the fourth electrode layer 116 may extend into the opening region, as shown in FIG. 2. Both of the first electrode layer 12 and the fourth electrode layer 116 may be of a transparent electrically conductive material, which may increase the transmittance of the opening region.

Due to the orthographic projections of the first electrode layer 12 and the fourth electrode layer 116 on the substrate 11 overlap, a storage capacitance may be formed, which increases the pixel storage capacitance, ensures that in a small pixel space there is still a sufficient storage capacitance, increases the voltage retention rate, and ensures normal displaying. The voltage on the fourth electrode layer 116 may, for example, be a common voltage.

Referring to FIG. 2, an insulating layer 121 is disposed on the one side of the fourth electrode layer 116 that is away from the substrate 11, and the data line 41 is disposed on the one side of the insulating layer 121 that is away from the substrate 11. The first planarization layer 13 is disposed on the one side of the data line 41 that is away from the substrate 11, a through hole penetrates the insulating layer 121, and the orthographic projections of the through hole and the data line 41 on the substrate 11 do not intersect or overlap.

By disposing the fourth electrode layer 116 between the data line 41 and the first electrode layer 12, that may prevent formation of a coupling capacitance due to a too small distance between the data line 41 and the first electrode layer 12. Due to the fourth electrode layer 116 is connected to a constant electric potential, even if the signal in the data line 41 varies at a high frequency, the influence on the first electrode layer 12 by the signal in the data line 41 may be shielded, and in turn the influence on the pixel voltage on the pixel-electrode layer by the data line 41 is shielded, thereby implementing the normal displaying of the pixel.

Referring to FIG. 1, the displaying base plate includes an opening region, a color-resistor layer 117 is disposed on the side of the first electrode layer 12 that is away from the substrate 11, and the orthographic projection of the color-resistor layer 117 on the substrate 11 covers the opening region; and the first planarization layer 13 is disposed on the side of the color-resistor layer 117 that is away from the substrate 11, and the orthographic projection of the through hole on the substrate 11 and the orthographic projection of the color-resistor layer 117 on the substrate 11 do not overlap.

In a particular implementation, the process may include firstly patterning sequentially the one side of the first passivation layer 110 that is away from the substrate 11 to form the first electrode layer 12 and the color-resistor layer 117, and subsequently forming the first planarization layer 13 on the one side of the color-resistor layer 117 and the first electrode layer 12 that is away from the substrate 11.

The color-resistor layer 117 may include a red-color color-resistor layer, a green-color color-resistor layer and a blue-color color-resistor layer. The color-resistor layers are disposed in different sub-pixel units, to implement color displaying.

In the present implementation, by disposing the color-resistor layer on the displaying base plate, wherein the displaying base plate is close to the backlight source in the displaying device, interference between the light rays of the neighboring sub-pixel units, which affects the effect of displaying, may be reduced.

In an optional implementation, referring to FIG. 1 to FIG. 3, a third passivation layer 118 and a common-electrode layer 119 are disposed in stack on the one side of the third electrode layer 16 that is away from the substrate 11, and the third passivation layer 118 is disposed close to the substrate 11. The material of the common-electrode layer 118 may be a transparent electrically conductive material or a metal material, which is not limited in the present embodiment.

The common-electrode layer 118 may include a plurality of strip electrodes. The plurality of strip electrodes may form a horizontal electric field with the pixel-electrode layer 19. The width and the spacing of the strip electrodes may be designed according to practical demands, which is not limited in the present embodiment. In order to reduce interference between the light rays of the neighboring pixels, the material of the common-electrode layer 118 may be a metal.

In an optional implementation, referring to FIG. 1, an isolating pillar 120 is disposed on the one side of the first planarization layer 13 that is away from the substrate 11, and the isolating pillar 120 and the second planarization layer 15 are formed at the same time. The materials of the isolating pillar 120 and the second planarization layer 15 are the same, and they are formed by using the same one process, which may simplify the process steps, and reduce the cost.

Another embodiment of the present disclosure further provides a displaying device, wherein the displaying device may include the displaying base plate according to any one of the above embodiments.

It should be noted that the displaying device according to the present embodiment may be any products or components that have the function of 2D or 3D displaying, such as a display panel, an electronic paper, a mobile phone, a tablet personal computer, a TV set, a notebook computer, a digital photo frame and a navigator.

Another embodiment of the present disclosure further provides a manufacturing method of a displaying base plate, wherein the manufacturing method includes:
Step 11: providing a substrate;
Step 12: forming a first electrode layer on one side of the substrate, wherein the first electrode layer includes a first electrode pattern;
Step 13: forming sequentially a first planarization layer on one side of the first electrode layer that is away from the substrate, wherein the first planarization layer is provided with a through hole, and the through hole penetrates the first planarization layer, to expose the first electrode pattern; and
Step 14: forming sequentially a second electrode layer, a second planarization layer and a third electrode layer on one side of the first planarization layer that is away from the substrate, wherein an orthographic projection of the second electrode layer on the substrate covers an orthographic projection of the through hole on the substrate, the second electrode layer is used to be connected to the first electrode pattern and the third electrode layer, and the second planarization layer is for planarizing the through hole.

By using the manufacturing method according to the present embodiment, the displaying base plate according to any one of the above embodiments may be obtained.

Figure 8:
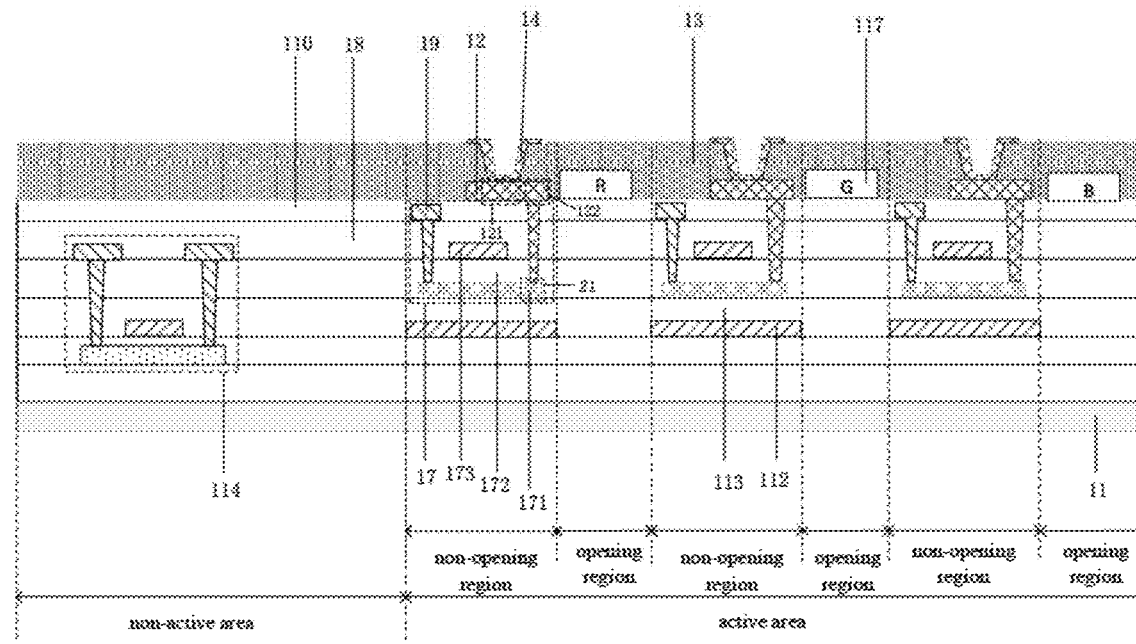
FIG. 8 shows a schematic sectional structural diagram of the displaying base plate according to an embodiment of the present disclosure when the second electrode layer is completely manufactured.
Figure 9:
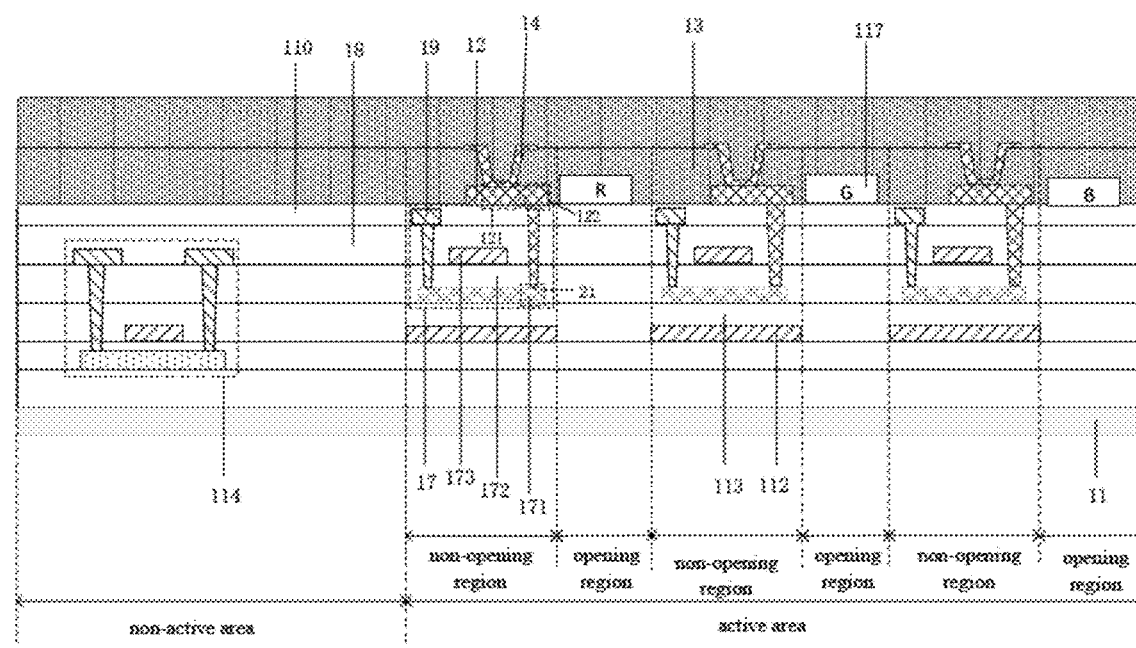
FIG. 9 shows a schematic sectional structural diagram of the displaying base plate according to an embodiment of the present disclosure when the second planarization-material layer is completely manufactured.
Figure 10:
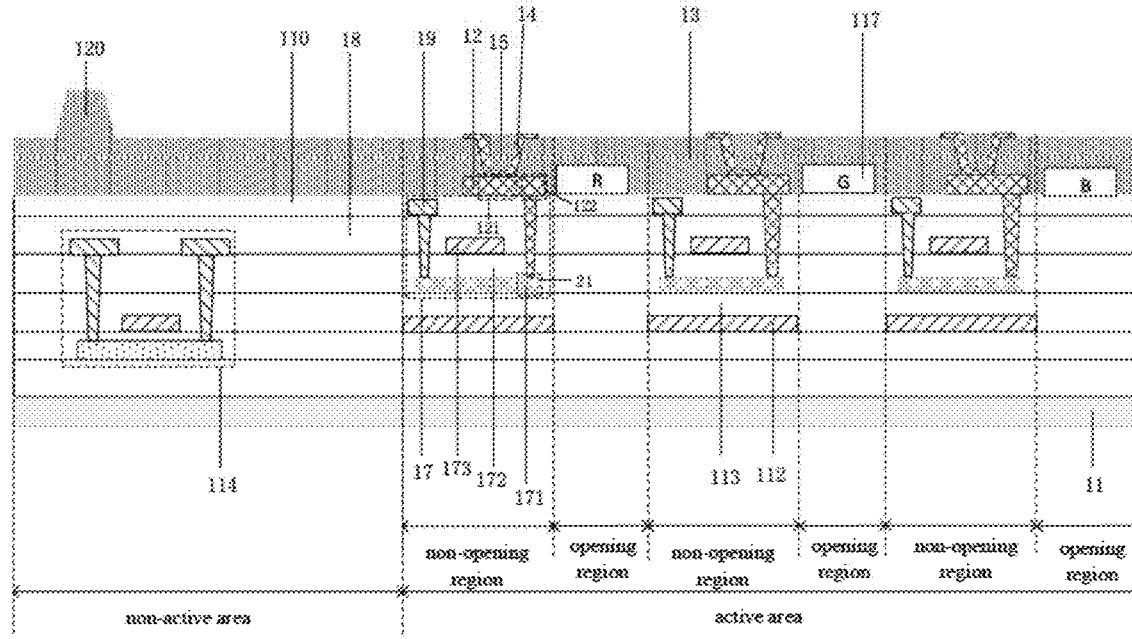
FIG. 10 shows a schematic sectional structural diagram of the displaying base plate according to an embodiment of the present disclosure when the second planarization layer is completely manufactured.
Figure 11:
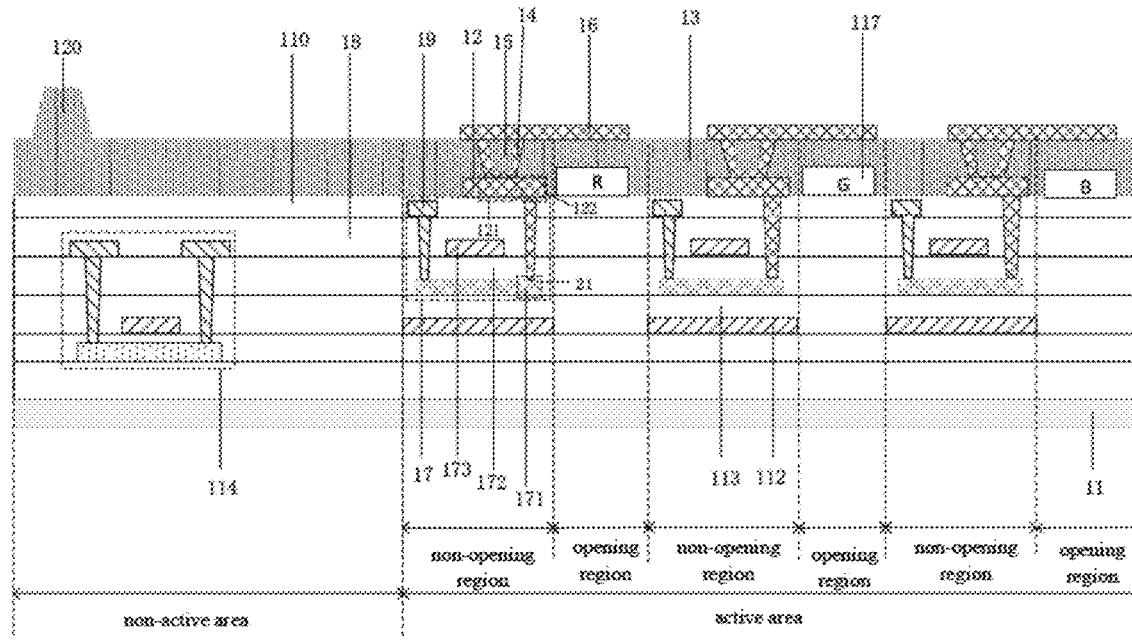
FIG. 11 shows a schematic sectional structural diagram of the displaying base plate according to an embodiment of the present disclosure when the third electrode layer is completely manufactured.
Figure 12:
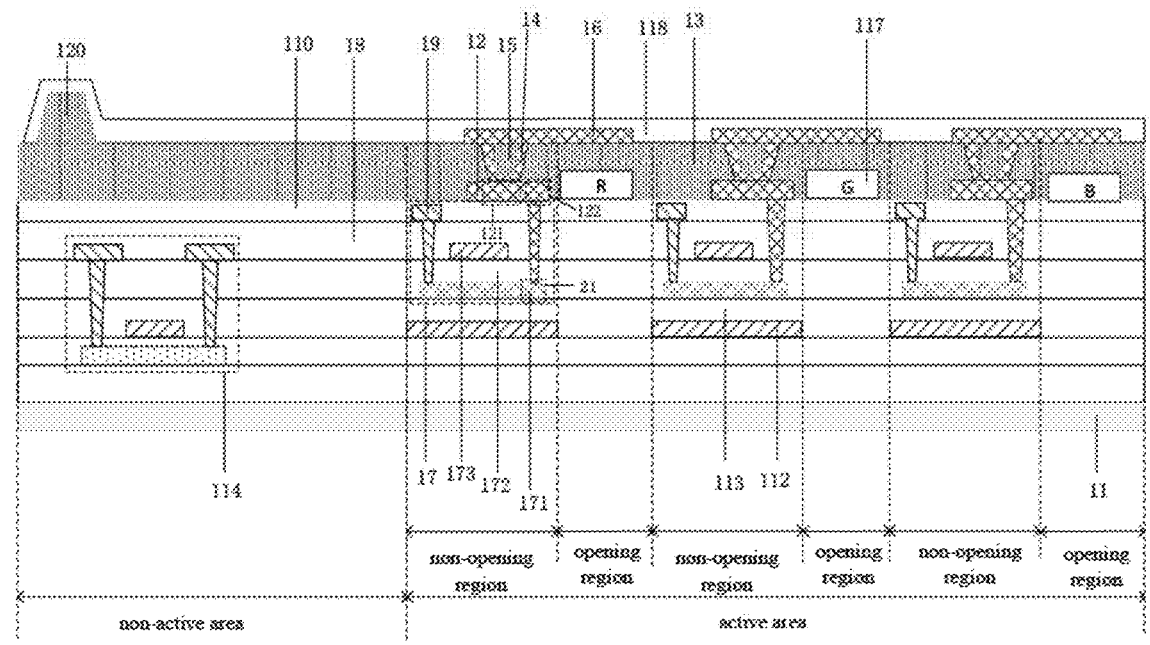
FIG. 12 shows a schematic sectional structural diagram of the displaying base plate according to an embodiment of the present disclosure when the third passivation layer is completely manufactured.

In an optional implementation, the manufacturing method of a displaying base plate according to the present embodiment may include the following steps:
Step 21: firstly complete the manufacturing of the first thin-film transistor 17 and the second thin-film transistor 114 on the substrate 11, and subsequently forming sequentially the first electrode layer 12, the first planarization layer 13 and the second electrode layer 14 on the one side of the first passivation layer 110 that is away from the substrate 11, wherein the first planarization layer 13 is provided with a through hole, the second electrode layer 14 covers the through hole, to form the displaying base plate shown in FIG. 8;
Step 22: manufacturing the second planarization-material layer filling the through hole in the first planarization layer 13, to form the displaying base plate shown in FIG. 9;
Step 23: patterning the second planarization-material layer, and by controlling the exposure energies at different regions, forming the isolating pillar 120 and the second planarization layer 15, to form the displaying base plate shown in FIG. 10, wherein the second planarization layer 15 is configured to fill and level up the through hole in the first planarization layer 13, and the materials of the second planarization layer 15 and the first planarization layer 13 may be the same or different;
Step 24: depositing ITO and patterning, to form the third electrode layer, to obtain the displaying base plate shown in FIG. 11;
Step 25: forming the third passivation layer 118 by deposition, to form the displaying base plate shown in FIG. 12; and
Step 26: patterning to form the common-electrode layer 119, to form the displaying base plate shown in FIG. 1.

Figure 13:
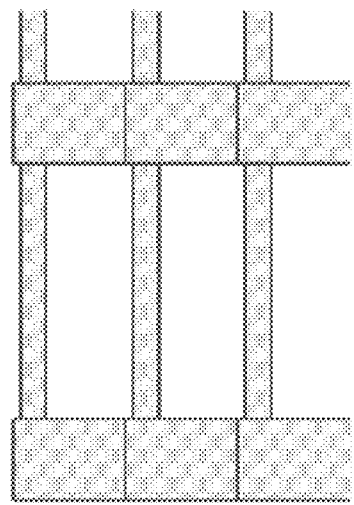
FIG. 13 shows a schematic sectional structural diagram of the displaying base plate according to an embodiment of the present disclosure when the common-electrode layer is completely manufactured.

In an optional implementation, the manufacturing method of a displaying base plate according to the present embodiment may include the following steps:
Step 31: manufacturing the barrier layer, wherein the barrier layer shields the channel region of the first thin-film transistor, to prevent the backlight from affecting the characteristics of the thin-film transistor. Referring to FIG. 13, FIG. 13 shows a schematic planar structural diagram of the displaying base plate when the barrier layer is completely manufactured.

Figure 14:
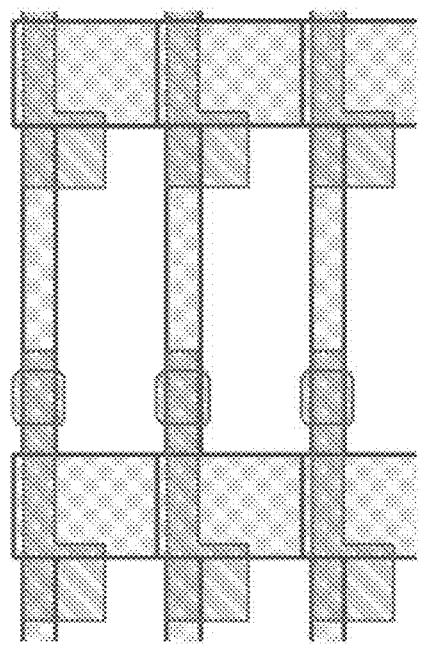
FIG. 14 shows a schematic planar structural diagram of the displaying base plate according to an embodiment of the present disclosure when the first active layer is completely manufactured.

Step 32: manufacturing a buffer layer and the first active layer of a metal oxide material, wherein the drain contacting region is located at the opening region, and due to the metal oxide is transparent, it does not affect the pixel aperture ratio. Referring to FIG. 14, FIG. 14 shows a schematic planar structural diagram of the displaying base plate when the first active layer is completely manufactured.

Figure 15:
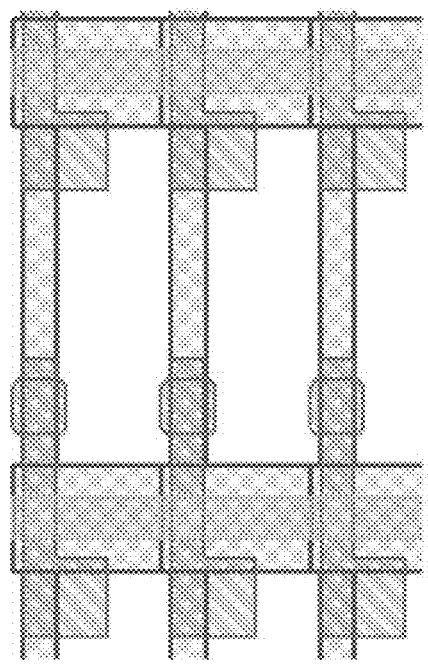
FIG. 15 shows a schematic planar structural diagram of the displaying base plate according to an embodiment of the present disclosure when the first grid is completely manufactured.

Step 34: manufacturing the first grid insulating layer and the first grid, wherein the first grid is located in the barrier layer, to ensure that the channel region in the first active layer is shielded by the barrier layer. Referring to FIG. 15, FIG. 15 shows a schematic planar structural diagram of the displaying base plate when the first grid is completely manufactured.

Figure 16:
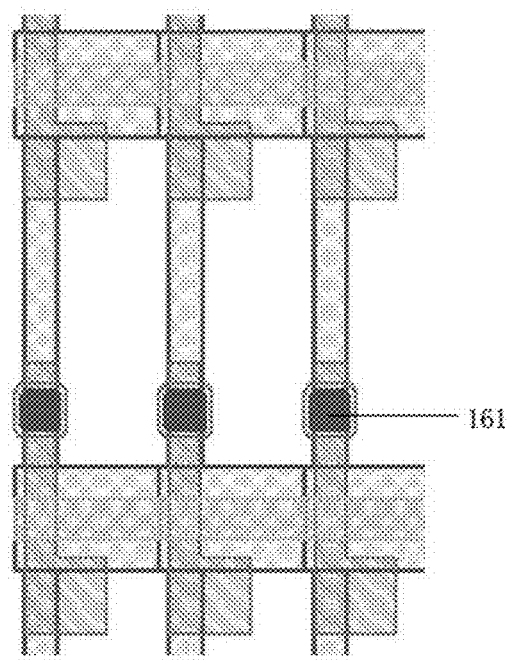
FIG. 16 shows a schematic planar structural diagram of the displaying base plate according to an embodiment of the present disclosure when the first interlayer dielectric layer is completely manufactured.

Step 35: manufacturing the first interlayer dielectric layer, and perforating the first active layer at the position corresponding to the source contacting region, such as 161 in FIG. 16, to facilitate the subsequent lap joining between the film layer and the first active layer. Referring to FIG. 16, FIG. 16 shows a schematic planar structural diagram of the displaying base plate when the first interlayer dielectric layer is completely manufactured.

Figure 17:
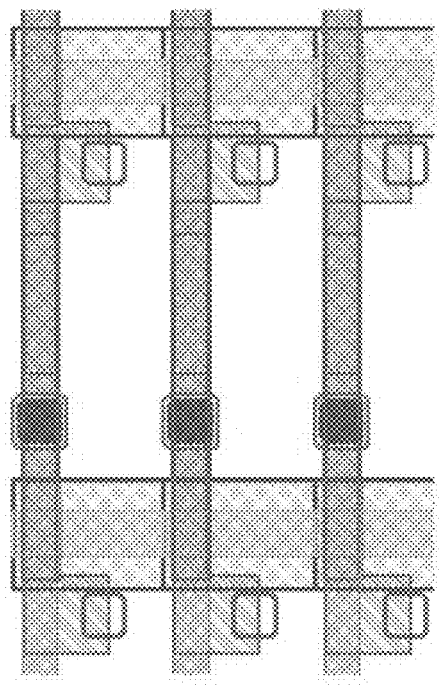
FIG. 17 shows a schematic planar structural diagram of the displaying base plate according to an embodiment of the present disclosure when the data line is completely manufactured.

Step 36: manufacturing the data line, wherein the data line is connected to the source contacting region by a via hole disposed in the first interlayer dielectric layer. Referring to FIG. 17, FIG. 17 shows a schematic planar structural diagram of the displaying base plate when the data line is completely manufactured.

Figure 18:
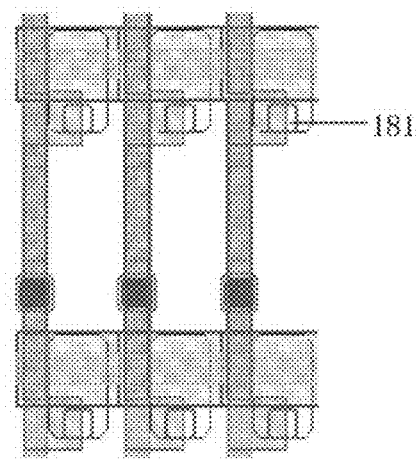
FIG. 18 shows a schematic planar structural diagram of the displaying base plate according to an embodiment of the present disclosure when the first electrode layer is completely manufactured.

Step 37: manufacturing the first passivation layer and the first electrode layer, and perforating the first passivation layer at the position corresponding to the drain contacting region of the first active layer, such as 181 in FIG. 18, wherein the first electrode layer is connected to the drain contacting region by a via hole disposed in the first passivation layer. Referring to FIG. 18, FIG. 18 shows a schematic planar structural diagram of the displaying base plate when the first electrode layer is completely manufactured.

Figure 19:
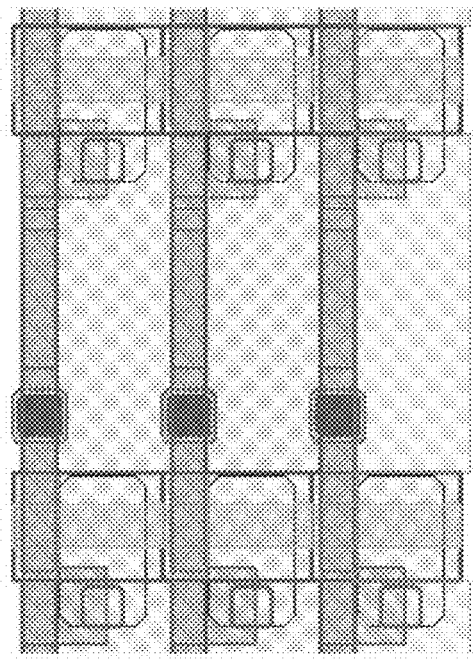
FIG. 19 shows a schematic planar structural diagram of the displaying base plate according to an embodiment of the present disclosure when the color-resistor layer is completely manufactured.

Step 38: manufacturing the color-resistor layer, wherein by disposing the color-resistor layer on the displaying base plate, interference between lights of different colors may be effectively reduced. Referring to FIG. 19, FIG. 19 shows a schematic planar structural diagram of the displaying base plate when the color-resistor layer is completely manufactured.

Figure 20:
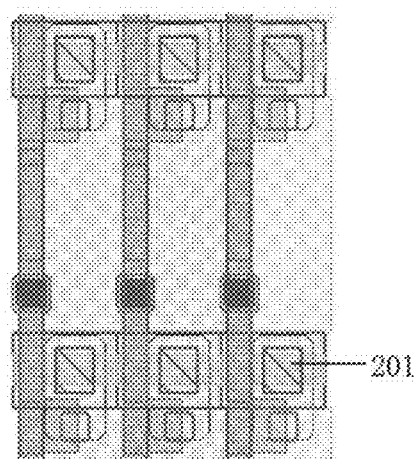
FIG. 20 shows a schematic planar structural diagram of the displaying base plate according to an embodiment of the present disclosure when the first planarization layer is completely manufactured.

Step 39: manufacturing the first planarization layer, and forming the through hole, such as 201 in FIG. 20. Referring to FIG. 20, FIG. 20 shows a schematic planar structural diagram of the displaying base plate when the first planarization layer is completely manufactured.

Step 310: forming sequentially the second electrode layer, the second planarization layer and the third electrode layer, wherein the second electrode layer and the third electrode layer are separately formed, and the second planarization layer is configured to fill and level up the through hole in the first planarization layer. Such a structure does not only ensure the electric connection between the third electrode layer and the first electrode layer, but also ensures the flatness of the entire face of the third electrode layer, to ensure the formation of a uniform electric field with the common-electrode layer.

Figure 21:
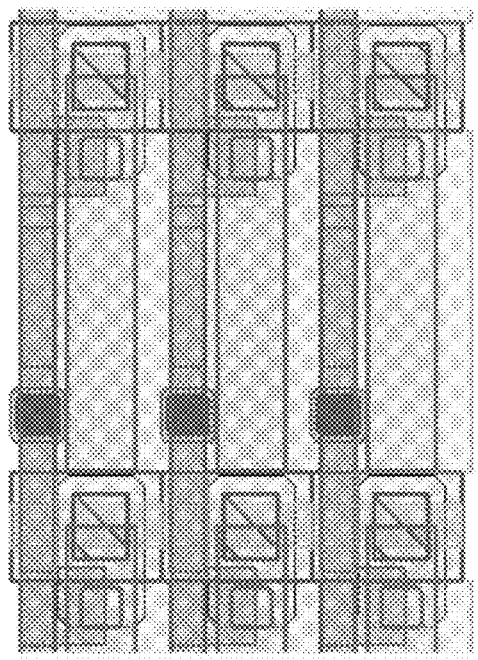
FIG. 21 shows a schematic planar structural diagram of the displaying base plate according to an embodiment of the present disclosure when the third electrode layer is completely manufactured.

Referring to FIG. 21, FIG. 21 shows a schematic planar structural diagram of the displaying base plate when the third electrode layer is completely manufactured.

Figure 22:
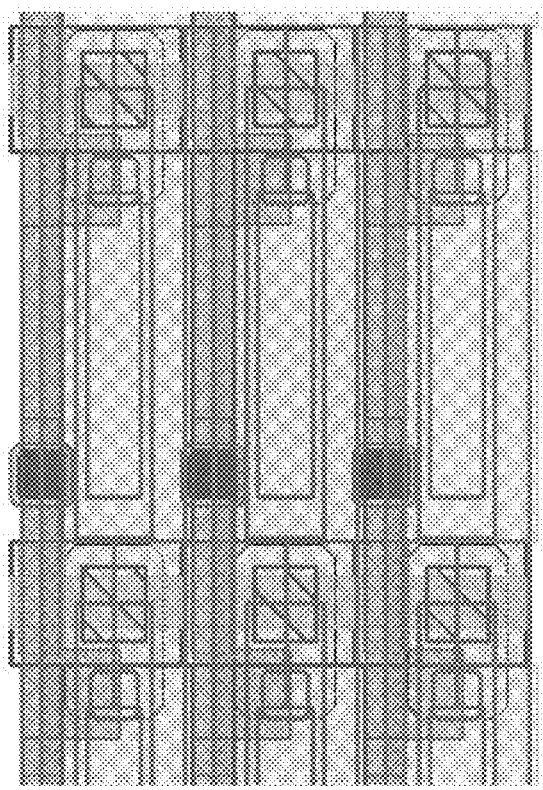
FIG. 22 shows a schematic planar structural diagram of the displaying base plate according to an embodiment of the present disclosure when the common-electrode layer is completely manufactured.

Step 311: manufacturing the third passivation layer and the common-electrode layer, wherein the common-electrode layer and the third electrode layer together form an electric field, to drive the liquid-crystal deflection. Referring to FIG. 22, FIG. 22 shows a schematic planar structural diagram of the displaying base plate when the common-electrode layer is completely manufactured. Accordingly, the displaying base plate shown in FIG. 1 may be obtained.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "include" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The displaying base plate and the manufacturing method thereof, and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

A person skilled in the art, after considering the description and implementing the invention disclosed herein, will readily envisage other embodiments of the present disclosure. The present disclosure aims at encompassing any variations, uses or adaptative alternations of the present disclosure, wherein those variations, uses or adaptative alternations follow the general principle of the present disclosure and include common knowledge or common technical means in the art that are not disclosed by the present disclosure. The description and the embodiments are merely deemed as exemplary, and the true scope and spirit of the present disclosure are presented by the following claims.

It should be understood that the present disclosure is not limited to the accurate structure that is described above and shown in the drawings, and may have various modifications and variations without departing from its scope. The scope of the present disclosure is merely limited by the appended claims.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description disposed herein describes many concrete details. However, it may be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "include" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he may still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A displaying base plate, wherein the displaying base plate comprises:

a substrate, and a first electrode layer disposed on one side of the substrate, wherein the first electrode layer comprises a first electrode pattern;

a first planarization layer disposed on one side of the first electrode layer that is away from the substrate, wherein the first planarization layer is provided with a through hole, and the through hole penetrates the first planarization layer, to expose the first electrode pattern; and a second electrode layer, a second planarization layer and a third electrode layer that are disposed in stack on one side of the first planarization layer that is away from the substrate, wherein the second electrode layer is disposed close to the substrate, an orthographic projection of the second electrode layer on the substrate covers an orthographic projection of the through hole on the substrate, the second electrode layer is connected to the first electrode pattern and the third electrode layer, and the second planarization layer fills the through hole to planarize the through hole;

an active area and a non-active area, and the active area comprises an opening region and a non-opening region, wherein the non-opening region at least refers to a region where an orthographic projection of a barrier layer on the substrate overlaps with the substrate, the opening region refers to a region where the orthographic projection of the barrier layer on the substrate does not overlap with the substrate;

a first thin-film transistor disposed on one side of the substrate that is closer to the first electrode layer, the first thin-film transistor is located at the active area, the first thin-film transistor comprises a first active layer, a first grid insulating layer, a first grid, a first interlayer dielectric layer and a first source that are disposed in stack, the first active layer is disposed close to the substrate, and the first active layer comprises a drain contacting region, and the drain contacting region is located at the opening region;

orthographic projections of the first grid insulating layer and the first interlayer dielectric layer on the substrate do not intersect or overlap with the opening region;

the drain contacting region is the first electrode pattern; and the drain contacting region is directly contacted with the substrate.

2. The displaying base plate according to claim 1, wherein the active area further comprises a data line and a scanning line, the first source extends in a first direction to form the data line, the first grid extends in a second direction intersecting with the first direction to form the scanning line, and both of orthographic projections of the data line and the scanning line on the substrate cover an orthographic projection of a channel region of the first active layer on the substrate.

3. The displaying base plate according to claim 1, wherein the barrier layer and a second interlayer dielectric layer are disposed in stack between the first active layer and the substrate, the barrier layer is disposed closer to the substrate, and an orthographic projection of the barrier layer on the substrate covers an orthographic projection of a channel region of the first active layer on the substrate.

4. The displaying base plate according to claim 3, wherein the active area further comprises a data line and a scanning line, and the orthographic projection of the barrier layer on the substrate covers orthographic projections of the data line and the scanning line on the substrate.

5. The displaying base plate according to claim 3, wherein the barrier layer is connected to a constant-electric-potential input terminal.

6. The displaying base plate according to claim 3, wherein the barrier layer and the first source are connected by via holes disposed in the second interlayer dielectric layer, the first grid insulating layer and the first interlayer dielectric layer.

7. The displaying base plate according to claim 1, wherein the displaying base plate further comprises a second thin-film transistor, the second thin-film transistor is located at the non-active area, and a material of an active layer of the second thin-film transistor comprises a polycrystalline silicon.

8. The displaying base plate according to claim 1, wherein a channel region of the first active layer comprises a first channel region, a first resistor region and a second channel region that are disposed sequentially in a first direction, the first grid comprises a first sub-grid and a second sub-grid that are disposed, respectively, an orthographic projection of the first sub-grid on the substrate covers an orthographic projection of the first channel region on the substrate, and an orthographic projection of the second sub-grid on the substrate covers an orthographic projection of the second channel region on the substrate.

9. A displaying device, wherein the displaying device comprises the displaying base plate according to claim 1.

* * * * *